US010743448B2

(12) United States Patent
Ninomiya et al.

(10) Patent No.: US 10,743,448 B2
(45) Date of Patent: Aug. 11, 2020

(54) SUBSTRATE POSITION DETECTION DEVICE

(71) Applicant: CKD Corporation, Aichi (JP)

(72) Inventors: Takahiro Ninomiya, Aichi (JP);
Kensuke Takamura, Aichi (JP);
Nobuyuki Umemura, Aichi (JP)

(73) Assignee: CKD CORPORATION, Aichi (JP)

( * ) Notice: Subject to any disclaimer, the term of this patent is extended or adjusted under 35 U.S.C. 154(b) by 72 days.

(21) Appl. No.: 16/258,817

(22) Filed: Jan. 28, 2019

(65) Prior Publication Data

US 2019/0174662 A1    Jun. 6, 2019

Related U.S. Application Data

(63) Continuation of application No. PCT/JP2017/015137, filed on Apr. 13, 2017.

(30) Foreign Application Priority Data

Jul. 28, 2016  (JP) ................................ 2016-148230

(51) Int. Cl.
*H05K 13/08* (2006.01)
*H05K 13/04* (2006.01)
*G01N 21/84* (2006.01)
*H05K 1/02* (2006.01)
*H05K 3/00* (2006.01)

(52) U.S. Cl.
CPC ........... *H05K 13/081* (2018.08); *G01N 21/84* (2013.01); *H05K 1/0269* (2013.01);
(Continued)

(58) Field of Classification Search
CPC ........... G01N 21/6452; G01N 21/6456; G01N 21/8806; G01N 21/84; G02B 21/06;
(Continued)

(56) References Cited

U.S. PATENT DOCUMENTS 7,115,435 B2 * 10/2006 Yuri ...................... G03F 9/7076
438/42
8,335,408 B2 * 12/2012 Sekiya ................. H04B 10/801
385/24
(Continued)

FOREIGN PATENT DOCUMENTS

JP  H11-261299 A  9/1999
JP  2008-047905 A  2/2008
(Continued)

OTHER PUBLICATIONS

International Preliminary Report on Patentability for corresponding International Application No. PCT/JP2017/015137, dated Feb. 7, 2019 (3 pages).
(Continued)

*Primary Examiner* — Jingge Wu
(74) *Attorney, Agent, or Firm* — Osha Liang LLP

(57) ABSTRACT

A substrate position detection device includes: an irradiator that irradiates a predetermined range of a substrate with a predetermined light; an imager that takes an image of the predetermined range of the substrate irradiated with the predetermined light; a moving mechanism that causes a relative movement of the imager and the substrate; and a controller that: detects a position of the substrate by sequentially executing to a plurality of recognition objects on the substrate: a moving process of relatively moving the imager to a position corresponding to a predetermined recognition object among the plurality of recognition objects on the substrate; an imaging process of taking an image of the predetermined recognition object under a predetermined imaging condition; and a recognition process of recognizing the predetermined recognition object based on image data obtained by the imaging process.

18 Claims, 7 Drawing Sheets

(52) U.S. Cl.
CPC ........... *H05K 3/0044* (2013.01); *H05K 13/04* (2013.01); *H05K 2201/09009* (2013.01); *H05K 2201/09918* (2013.01)

(58) Field of Classification Search
CPC .... G02B 6/43; H04B 10/801; H05K 13/0812; H05K 13/081; H05K 13/04; H05K 1/0269; H05K 1/283; H05K 3/0044
See application file for complete search history.

(56) References Cited

U.S. PATENT DOCUMENTS

| | | | | |
|---|---|---|---|---|
| 8,389,959 | B2* | 3/2013 | Takahashi | G01J 3/10 250/459.1 |
| 8,710,783 | B2* | 4/2014 | Sato | H02P 27/08 318/400.04 |
| 8,845,114 | B2* | 9/2014 | Okada | G01N 21/8806 362/3 |
| 10,564,518 | B2* | 2/2020 | Tindall | G03B 15/02 |

FOREIGN PATENT DOCUMENTS

| | | |
|---|---|---|
| JP | 2009-182280 A | 8/2009 |
| JP | 2010-160006 A | 7/2010 |

OTHER PUBLICATIONS

Written Opinion for corresponding International Application PCT/JP2017/015137, dated Jul. 18, 2017 (12 pages).
International Search Report for corresponding International Application No. PCT/JP2017/015137, dated Jul. 18, 2017 (5 pages).
Office Action in counterpart Japanese Patent Application No. 2016-148230 dated Sep. 5, 2017 (9 pages).

\* cited by examiner

SUBSTRATE POSITION DETECTION DEVICE

BACKGROUND

Technical Field

The present invention relates to a substrate position detection device configured to detect the position of a printed circuit board or the like.

Description of Related Art

In a general production line of mounting an electronic component on a printed circuit board, solder paste is printed first on a printed circuit board by a solder printing device (solder printing process). The electronic component is subsequently mounted on the printed circuit board by a component mounting device (mounting process). The electronic component is temporarily mounted by the viscosity of solder paste or the like. The printed circuit board is then introduced into a reflow furnace to be subject to soldering (reflow process).

The production line is also equipped with, for example, a solder printing inspection device configured to inspect the printing state of solder paste, prior to mounting of a component or a mounting inspection device configured to inspect the printed circuit board after mounting of the component.

Accompanied with an increase in degree of integration of the printed circuit board and downsizing of the component to be mounted, there is a demand for highly accurate positioning of the printed circuit board in the various devices described above. Detection and correction of the position of the printed circuit board are accordingly executed in a previous stage prior to various operations executed in the above various devices.

A general procedure takes images of a plurality of recognition marks provided on a printed circuit board with a camera and recognizes the respective recognition marks based on the obtained image data, so as to determine the inclination and the positional misalignment of the printed circuit board.

As one of the position detection techniques using such recognition marks, a known technique with a view to increasing the speed of position detection of a substrate takes an image of a first recognition mark at a first position on a printed circuit board with a predetermined camera, executes a recognition process of the first recognition mark based on image data obtained by imaging at the first position while moving the camera to a second position corresponding to a second recognition mark, subsequently takes an image of the second recognition mark at the second position, and then executes a recognition process of the second recognition mark based on the obtained image data (as described in, for example, Patent Literature 1).

In some cases, however, the recognition mark may not be appropriately recognized from the image data obtained by imaging, due to various reasons, for example, the conditions and the type of the printed circuit board and the imaging conditions employed to take the image of the recognition mark. In such cases, the production line is stopped in response to detection of a recognition error and requires the operator's manual adjustment operation.

The occurrence of even one recognition error is thus likely to significantly lower the productivity. The recognition error occurs at a low rate (for example, about 1 to 5%) but is inevitable in the production line of printed circuit boards. Accordingly, even the prior art technique with a view to increasing the speed of position detection of the substrate, like the technique described in Patent Literature 1, is likely to lower the overall processing capacity.

In the case of a failure in recognizing the recognition mark, a recently proposed technique changes, for example, the luminance of illumination without requiring the operator's any manual operation and retries the imaging process and the recognition process of the recognition mark (as described in, for example, Patent Literature 2).

CITATION LIST

Patent Literatures

PTL 1: JP H11-261299A
PTL 2: JP 2009-182280A

The technique described in Patent Literature 2, however, stands by the camera at the first position after taking an image of the first recognition mark at the first position on the printed circuit board with the camera and does not allow the camera to move to the second position corresponding to the second recognition mark, until the result of the recognition process of the first recognition mark is obtained (until requirement or non-requirement for the retry is determined), irrespective of whether the first recognition mark is appropriately recognized (whether the retry is required or not).

Even in the case of successful recognition without any retry with regard to all the recognition marks, the time period required for position detection of the printed circuit board is accordingly longer than the time period required for the technique described in Patent Literature 1. There is accordingly a difficulty in increasing the speed of position detection of the substrate. As a result, this is likely to lower the productivity.

SUMMARY

A substrate position detection device according to one or more embodiments is configured to increase the speed of position detection of a substrate and suppress the productivity from being lowered.

Embodiments of the present invention are described. Functions and advantageous effects according to one or more embodiments are also described as appropriate.

A substrate position detection device according to one or more embodiments comprises: an irradiator configured to irradiate a predetermined range of a substrate with a predetermined light; an imaging unit configured to take an image of the predetermined range of the substrate irradiated with the predetermined light; and a moving unit configured to cause a relative movement of at least the imaging unit and the substrate. The substrate position detection device is configured to sequentially execute a moving process of causing relative movement of the imaging unit to a position corresponding to a predetermined recognition object among a plurality of recognition objects provided on the substrate, an imaging process of taking an image of the predetermined recognition object under a predetermined imaging condition, and a recognition process of recognizing the predetermined recognition object, based on image data obtained by the imaging process, with regard to the plurality of recognition objects, so as to detect position of the substrate. After termination of the imaging process with regard to the predetermined recognition object among the plurality of recognition objects, the substrate position detection device executes the recognition process with regard to the predetermined recognition object, while executing the moving process of causing relative movement of the imaging unit to a position corresponding to another recognition object that is different from the predetermined recognition object. When failing to recognize at least one recognition object among the plurality of recognition objects by at least the recognition process executed with regard to all the plurality of recognition objects, the substrate position detection device executes a re-imaging process of taking an image of the recognition object of the failed recognition again at a position corresponding to the recognition object and a re-recognition process of recognizing the recognition object, based on image data obtained by the re-imaging process.

The above "recognition process (re-recognition process)" is only required to determine whether the recognition object is recognizable from at least the image data obtained by the imaging process (re-imaging process). It is not necessary to calculate position information (coordinate) of the recognition object at the stage of the above "recognition process (re-recognition process)".

After termination of the imaging process with regard to the predetermined recognition object, the substrate position detection device of one or more embodiments enables the recognition process with regard to the predetermined recognition object to be executed, while causing the relative movement of the imaging unit to a position corresponding to another recognition object. This configuration starts the relative movement of the imaging unit to the position corresponding to another recognition object without waiting for the result of the recognition process, regardless of whether the recognition object is appropriately recognized, after termination of the imaging process with regard to the predetermined recognition object. As a result, this configuration increases the speed of position detection of the substrate, like the technique described in Patent Literature 1, when all the recognition objects are successfully recognized without the retry process (re-imaging process and re-recognition process).

When there is any recognition object of the failed recognition by the recognition process executed with regard to all the recognition objects, on the other hand, the substrate position detection device of one or more embodiments is configured to automatically execute a retry process (re-imaging process and re-recognition process). This configuration eliminates a need to stop the device (production line) and start the operator's manual operation. As a result, this configuration enhances the overall processing capacity and suppresses the productivity from being lowered.

The substrate position detection device according to one or more embodiments may be configured to execute a change process of changing the imaging condition when the re-imaging process is executed.

In the case of a failure in recognizing the recognition object from the image data obtained by the previous imaging process, the substrate position detection device of one or more embodiments automatically changes the imaging condition (without requiring the operator's any operation) and executes the retry process. This configuration enables the recognition object of the failed recognition to be automatically recognized. For example, the change of the imaging condition may be determined, based on the image data obtained by the previous imaging process. In another example, the imaging condition may be changed over among a plurality of settings determined in advance in a predetermined sequence.

In the substrate position detection device according to one or more embodiments, a light intensity of the light radiated from the irradiator may be changed, as the imaging condition.

The recognition mark may be made recognizable by changing the light intensity of the radiation light. The configuration of one or more embodiments is especially effective in such cases. The excess or deficiency of the light intensity is readily determinable from the image data obtained by the previous imaging process. Determining the change of the imaging condition (for example, an increase or a decrease in light intensity) based on the image data obtained by the previous imaging process enables the retry process to be executed under the more appropriate imaging condition.

"Changing the light intensity of the light radiated from the irradiator" includes "changing the luminance of a light source used to radiate the light from the irradiator" and "changing the number of light sources used to radiate the light from the irradiator".

In the substrate position detection device according to one or more embodiments, a radiation angle of the light radiated from the irradiator may be changed, or at least one light source used to radiate the light from the irradiator may be changed, as the imaging condition.

For example, in the case of a solder leveler product with the surface of a recognition mark (recognition object) coated with solder, the surface of the recognition mark may not be flat. In such cases, the recognition mark may be made recognizable by changing the position of the light source or by changing the radiation angle. The configuration of one or more embodiments is especially effective in such cases. "Changing (the position of) at least one light source used to radiate the light from the irradiator" includes, for example, "adding or deleting a light source used to radiate the light from the irradiator".

In the substrate position detection device according to one or more embodiments, color of the light radiated from the irradiator may be changed, as the imaging condition.

The periphery (for example, a glass epoxy resin or a resist film) of the recognition object on a printed circuit board or the like has various colors. The recognition object may be made recognizable by changing the color of the radiation light. The configuration of one or more embodiments is especially effective in such cases.

In the substrate position detection device according to one or more embodiments, the substrate may be a printed circuit board with an electronic component mounted thereon.

The configuration of one or more embodiments enhances the positioning accuracy of a printed circuit board and thereby enhances the inspection accuracy of solder paste and the mounting accuracy of electronic components.

DETAILED DESCRIPTION OF EMBODIMENTS

Figure 1:
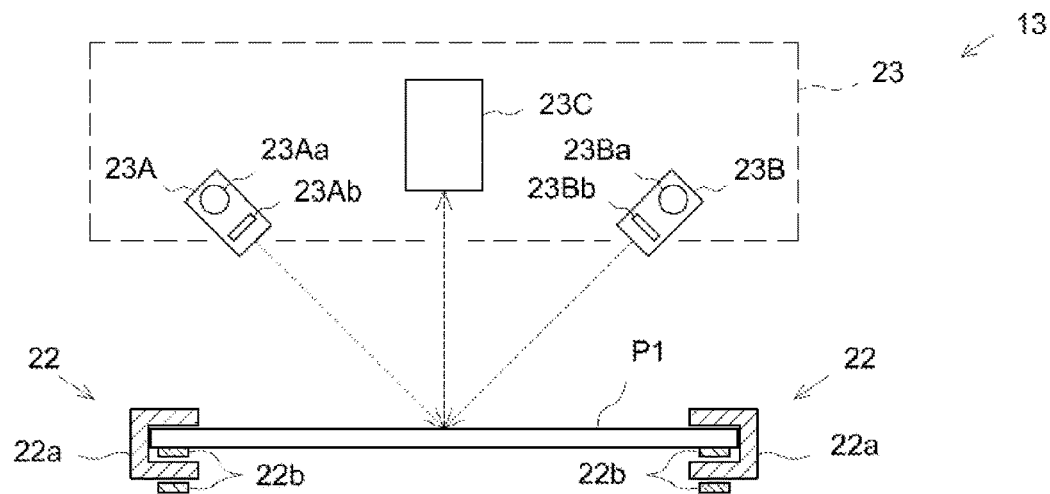
FIG. 1 is a schematic configuration diagram schematically illustrating a solder printing inspection device according to one or more embodiments.

The following describes embodiments of the present invention with reference to the drawings. FIG. 1 is a schematic configuration diagram schematically illustrating a solder printing inspection device 13 equipped with a substrate position detection device according one or more embodiments. The substrate position detection device according to one or more embodiments is embodied as one function of the solder printing inspection device 13.

Figure 4:
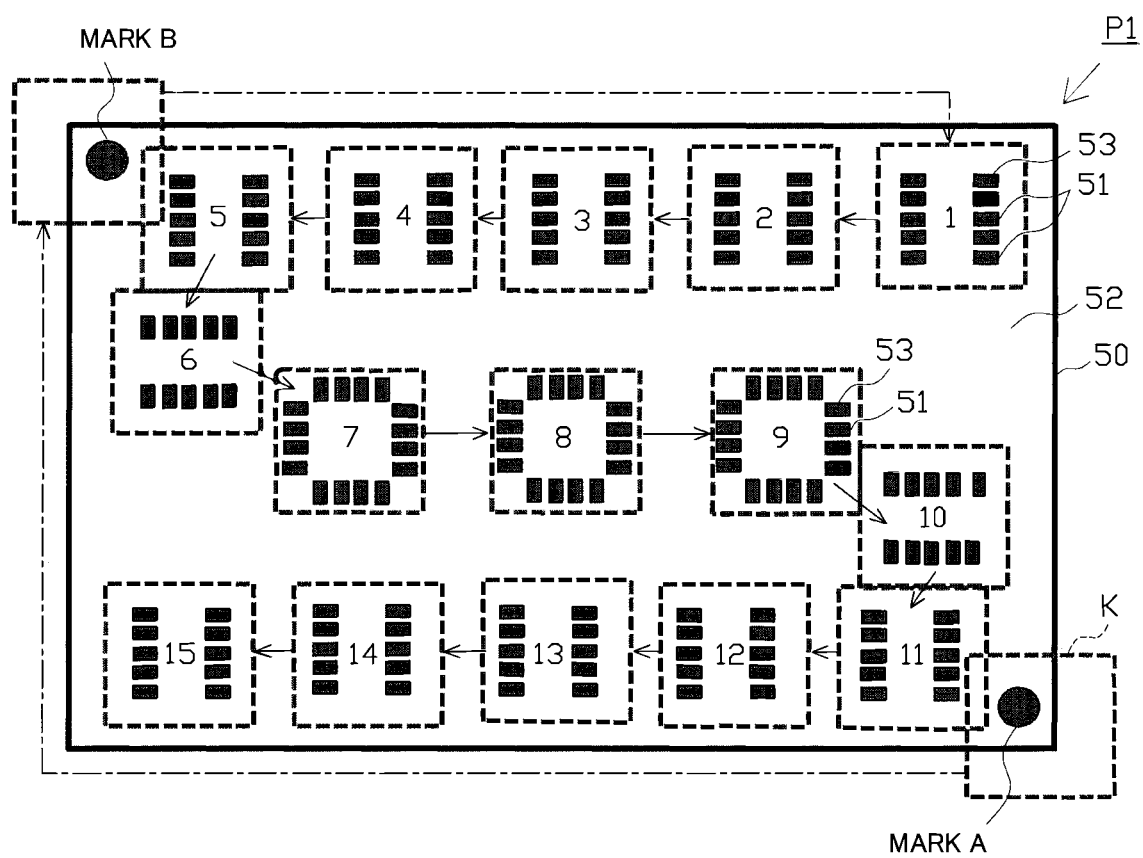
FIG. 4 is a plan diagram illustrating the configuration of the printed circuit board and a moving sequence of an imaging visual field of a camera according to one or more embodiments.

First, the configuration of a printed circuit board as an object of position detection by the substrate position detection device (i.e., an object of inspection by the solder printing inspection device 13) is described in detail. As shown in FIG. 4, a printed circuit board P1 is configured such that a pattern (not shown) and lands 51 made of copper foil are formed on the surface of a flat plate-like base substrate 50 made of, for example, a glass epoxy resin. Portions of the surface of the base substrate 50 other than the lands 51 are coated with a resist film 52. Solder paste 53 is printed on the lands 51.

Recognition marks are provided on the surface of the printed circuit board P1 as objects of recognition for position detection. More specifically, a first recognition mark [A] and a second recognition mark [B] in a circular shape are respectively provided at two corners aligned on a predetermined diagonal line among four corners on the surface of the printed circuit board P1. The recognition marks [A] and [B] according to one or more embodiments are formed from copper foil, like the lands 51.

Figure 2:
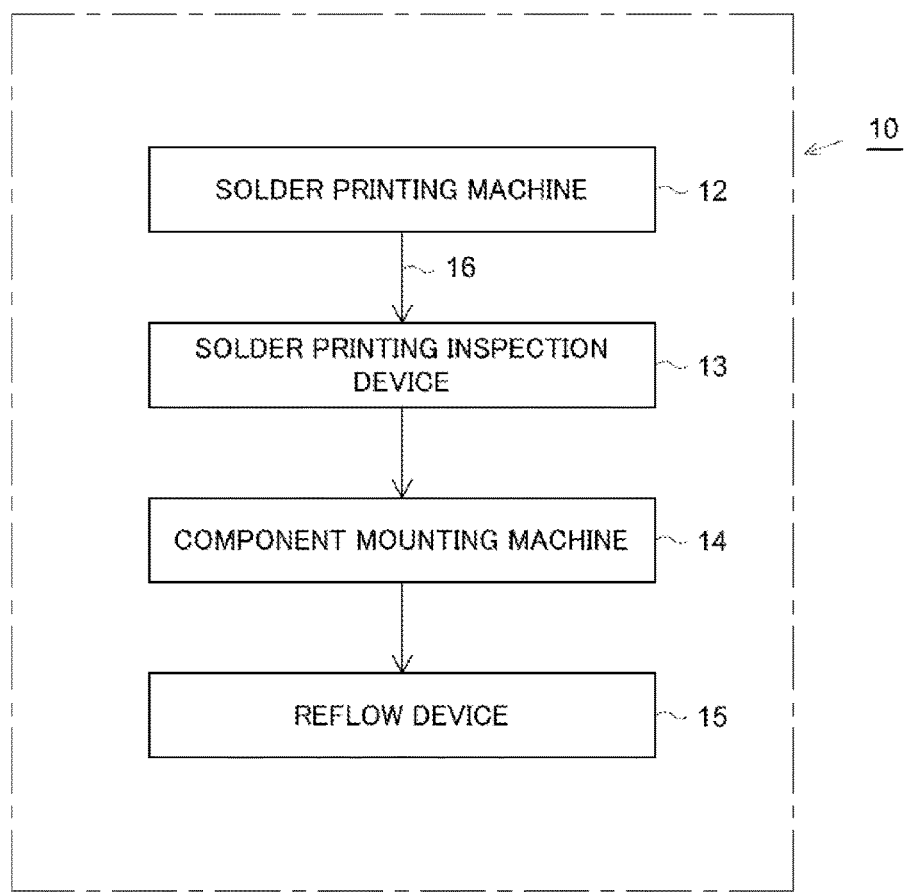
FIG. 2 is a block diagram illustrating the configuration of a production line of a printed circuit board according to one or more embodiments.

A production line of manufacturing the printed circuit board P1 is described next with reference to FIG. 2. FIG. 2 is a block diagram illustrating the configuration of a production line 10 of the printed circuit board P1. According to one or more embodiments, the production line 10 is set such that the printed circuit board P1 is conveyed rightward when being viewed from the front side.

In the production line 10, a solder printing machine 12, the solder printing inspection device 13, a component mounting machine 14 and a reflow device 15 are placed sequentially from its upstream side (left side in FIG. 2).

The solder printing machine 12 is configured to print the solder paste 53 on the lands 51 of the printed circuit board P1.

The solder printing inspection device 13 is configured to inspect the state of the solder paste 53 printed as described above. The details of the solder printing inspection device 13 will be described later.

The component mounting machine 14 is configured to mount an electronic component such as a chip (not shown) on the printed solder paste 53. The electronic component includes a plurality of electrodes and leads, and the respective electrodes and leads are temporarily mounted to predetermined locations of the solder paste 53.

The reflow device 15 is configured to heat and melt the solder paste 53 and solder joint (solder) the electrodes and the leads of the electronic component with the lands 51.

A conveyor 16 or the like configured to convey the printed circuit board P1 is provided between the respective devices, for example, between the solder printing machine 12 and the solder printing inspection device 13 on the production line 10 (as shown in FIG. 2). A branching unit is provided between the solder printing inspection device 13 and the component mounting machine 14, although not being illustrated. The printed circuit board P1 determined as a non-defective by the solder printing inspection device 13 is guided to the component mounting machine 14 on the downstream side, whereas the printed circuit board P1 determined as a defective is discharged to a defective storage by the branching unit.

Figure 3:
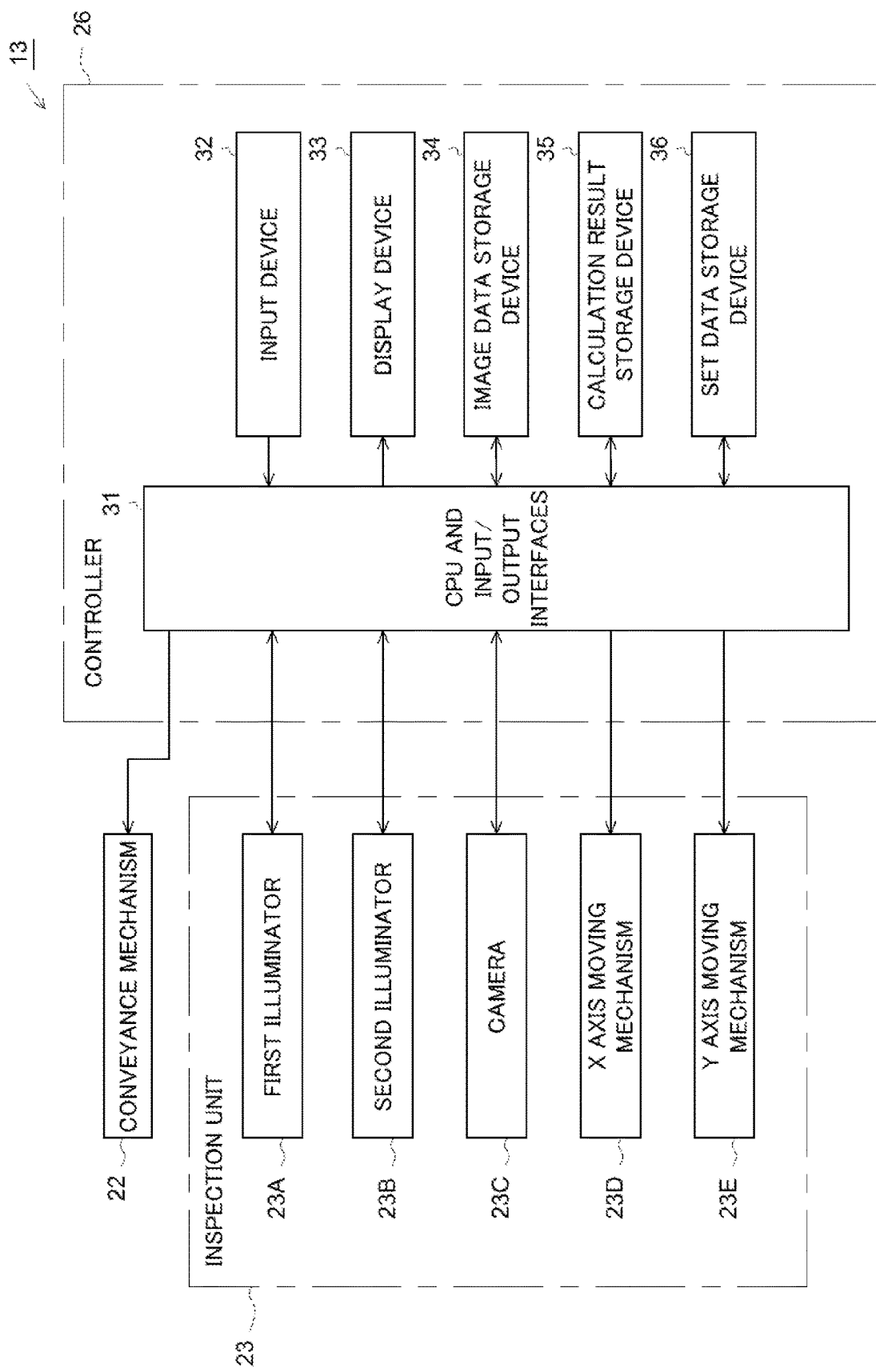
FIG. 3 is a block diagram illustrating the electrical configuration of the solder printing inspection device according to one or more embodiments.

The following describes the configuration of the solder printing inspection device 13 in detail. As shown in FIG. 1, the solder printing inspection device 13 includes a conveyance mechanism 22 configured to, for example, convey and position the printed circuit board P1; an inspection unit 23 configured to inspect the printed circuit board P1; and a controller 26 configured to execute various controls, image processing and arithmetic processing in the solder printing inspection device 13 including drive control of the conveyance mechanism 22 and the inspection unit 23 (as shown in FIG. 3). The controller 26 is configured as the processing execution unit according to one or more embodiments.

The conveyance mechanism 22 includes a pair of conveying rails 22a placed along a conveying direction of the printed circuit board P1, an endless conveyor belt 22b placed to be rotatable relative to the respective conveying rails 22a, a drive unit (not shown) such as a motor configured to drive the conveyor belt 22b, and a chuck mechanism (not shown) configured to position the printed circuit board P1 at a predetermined position, and is driven and controlled by the controller 26.

Under the configuration described above, the printed circuit board P1 carried into the solder printing inspection device 13 is placed on the conveyor belt 22b with respective edges of the printed circuit board P1 in a width direction perpendicular to the conveying direction inserted into the respective conveying rails 22a. The conveyor belt 22b starts operation to convey the printed circuit board P1 to a predetermined inspection position. When the printed circuit board P1 reaches the inspection position, the conveyor belt 22b stops, and the chuck mechanism operates. The operation of the chuck mechanism presses up the conveyor belt 22b, and the respective edges of the printed circuit board P1 are held by the conveyor belt 22b and the upper sides of the conveying rails 22a. The printed circuit board P1 is accordingly positioned and fixed at the inspection position. After termination of inspection, the fixation by the chuck mechanism is released, and the conveyor belt 22b starts operation. This causes the printed circuit board P1 to be carried out from the solder printing inspection device 13. The configuration of the conveyance mechanism 22 is not limited to the configuration of one or more embodiments, but another configuration may be employed alternatively.

The inspection unit 23 is placed above the conveying rails 22a (conveyance path of the printed circuit board P1). The inspection unit 23 includes a first illuminator 23A and a second illuminator 23B serving as the irradiator to irradiate a predetermined range (an inspection range or a recognition range) on the printed circuit board 1 obliquely downward with a predetermined light; a camera 23C serving as the imaging unit (imager) to take an image of the predetermined range on the printed circuit board P1 from immediately above; an X axis moving mechanism 23D configured to allow for a move in an X-axis direction (shown in FIG. 3); and a Y axis moving mechanism 23E configured to allow for a move in a Y-axis direction (shown in FIG. 3), and is driven and controlled by the controller 26.

Each of the first illuminator 23A and the second illuminator 23B is configured to change over the radiation light between light for three-dimensional measurement and light for position detection. More specifically, each of the first illuminator 23A and the second illuminator 23B is configured to irradiate a predetermined inspection range (inspection ranges "1" to "15" shown in FIG. 14) on the printed circuit board P1 with a predetermined light for three-dimensional measurement (for example, patterned light having a striped light intensity distribution) and is also configured to irradiate a predetermined recognition range (the first recognition mark [A] or the second recognition mark [B] shown in FIG. 4) with a predetermined light for position detection (for example, uniform light having a fixed light intensity).

The first illuminator 23A includes a first light source 23Aa configured to emit a predetermined light and a first liquid crystal shutter 23Ab configured to transmit the light from the first light source 23Aa, and is driven and controlled by the controller 26. The first liquid crystal shutter 23Ab is configured to form a first grating that converts the light from the first light source 23Aa into a first patterned light having a striped light intensity distribution. Accordingly, the first illuminator 23A changes over the radiation light between the uniform light and the pattered light by switching control of the first liquid crystal shutter 23Ab.

The second illuminator 23B includes a second light source 23Ba configured to emit a predetermined light and a second liquid crystal shutter 23Bb configured to transmit the light from the second light source 23Ba, and is driven and controlled by the controller 26. The second liquid crystal shutter 23Bb is configured to form a second grating that converts the light from the second light source 23Ba into a second patterned light having a striped light intensity distribution. Accordingly, the second illuminator 23B changes over the radiation light between the uniform light and the pattered light by switching control of the second liquid crystal shutter 23Bb.

Each of the first light source 23Aa and the second light source 23Ba is configured to change over the luminance of the radiation light in multiple stages.

Under the configuration described above, the light emitted from each of the light sources 23Aa and 23Ba is guided to a condenser lens (not shown) to be converted to parallel light, is guided to a projection lens (not shown) via the liquid crystal shutter 23Ab or 23Bb, and is projected as the uniform light or the patterned light on the printed circuit board P1.

Especially when the patterned light is projected in the process of three-dimensional measurement, switching control of the liquid crystal shutter 23Ab or 23Bb is executed to shift the phase of each corresponding patterned light by every ¼ pitch. Using the liquid crystal shutter 23Ab or 23Bb as the grating ensures radiation of the patterned light having a substantially ideal sinusoidal waveform. This configuration improves the measurement resolution of three-dimensional measurement. This configuration also provides electrical phase shift control of the patterned light and thereby achieves downsizing of the device.

The inspection range or the recognition range on the printed circuit board P1 is one area among a plurality of areas set in advance on the printed circuit board P1, in terms of the size of an imaging visual field (imaging range) K of the camera 23C as one unit (as shown in FIG. 4).

The controller 26 drives and controls the X axis moving mechanism 23D and the Y axis moving mechanism 23E to move the inspection unit 23 (imaging visual field K) to a location above an arbitrary inspection range or recognition range on the printed circuit board P1 that is positioned and fixed at the inspection position. The inspection unit 23 is successively moved to a plurality of recognition ranges and inspection ranges set on the printed circuit board P1 and executes a recognition process with regard to the respective recognition ranges and an inspection process with regard to the respective inspection ranges, so as to implement inspection of the entire area of the printed circuit board P1 (as shown in FIG. 4). Accordingly, the X axis moving mechanism 23D and the Y axis moving mechanism 23E constitute the moving unit according to one or more embodiments.

The camera 23C is configured to include a lens, an imaging element and the like. According to one or more embodiments, a CCD sensor is employed as the imaging element. The imaging element is, however, not limited to the CCD sensor, and another imaging element such as a CMOS sensor may be employed alternatively.

The camera 23C is driven and controlled by the controller 26. More specifically, the controller 26 executes an imaging process using the camera 23C, in synchronism with an irradiation process using the illuminators 23A and 23B.

Image data taken by the camera 23C is converted into a digital signal inside of the camera 23C, is transferred in the form of the digital signal to the controller 26, and is stored in an image data storage device 34 described later. The controller 26 executes, for example, image processing and arithmetic processing, based on the image data, as described later.

The following describes the electrical configuration of the controller 26. As shown in FIG. 3, the controller 26 includes a CPU and input/output interfaces 31 (hereinafter referred to as "CPU and the like 31") configured to control the entire solder printing inspection device 13; an input drive 32 serving as the "input unit" comprised of, for example, a keyboard, a mouse and a touch panel; a display device 33 serving as the "display unit" having a display screen such as a CRT or a liquid crystal display; an image data storage device 34 configured to store, for example, image data taken by the camera 23C; a calculation result storage device 35 configured to store results of various calculations; and a set data storage device 36 configured to store in advance various information such as gerber data (including information with regard to recognition marks). These devices 32 to 36 are electrically connected with the CPU and the like 31.

The set data storage device 36 stores information with regard to a plurality of recognition ranges and inspection ranges set on the printed circuit board P1 and a moving sequence of the imaging visual field K of the camera 23 to these recognition ranges and inspection ranges. The "moving sequence of the imaging visual field K" specifies a sequence of moving the imaging visual field K of the camera 23C with regard to the plurality of recognition ranges and inspection ranges set on the printed circuit board P1.

The plurality of recognition ranges and the inspection ranges on the printed circuit board P1 and the moving sequence of the imaging visual field K to these recognition ranges and inspection ranges may be set in advance automatically according to a predetermined program based on the gerber data and the like or may be set in advance manually by an operator.

According to one or more embodiments, at a normal time, the imaging visual field K of the camera 23C is first moved to a first recognition range corresponding to the first recognition mark [A] and is then moved to a second recognition range corresponding to the second recognition mark [B]. The subsequent moving sequence of the imaging visual field K is set from a predetermined inspection range that is determined in advance as the starting point to take the shortest way as the moving route of the inspection unit 23. For example, in the illustrated example of FIG. 4, the moving sequence (inspection sequence) of the imaging visual field K is set from an inspection range at an upper right corner as the starting point. In FIG. 4, each of ranges encircled by broken line frames represents the imaging visual field K (recognition range or inspection range), and the numerals "1" to "15" given to these ranges indicate the inspection sequence. In FIG. 4, the moving direction (moving route) of the imaging visual field K is shown by arrows.

The following describes in detail an inspection routine of the printed circuit board P1 executed by the solder printing inspection device 13. This inspection routine is executed by the controller 26 (CPU and the like 31).

Figure 5:
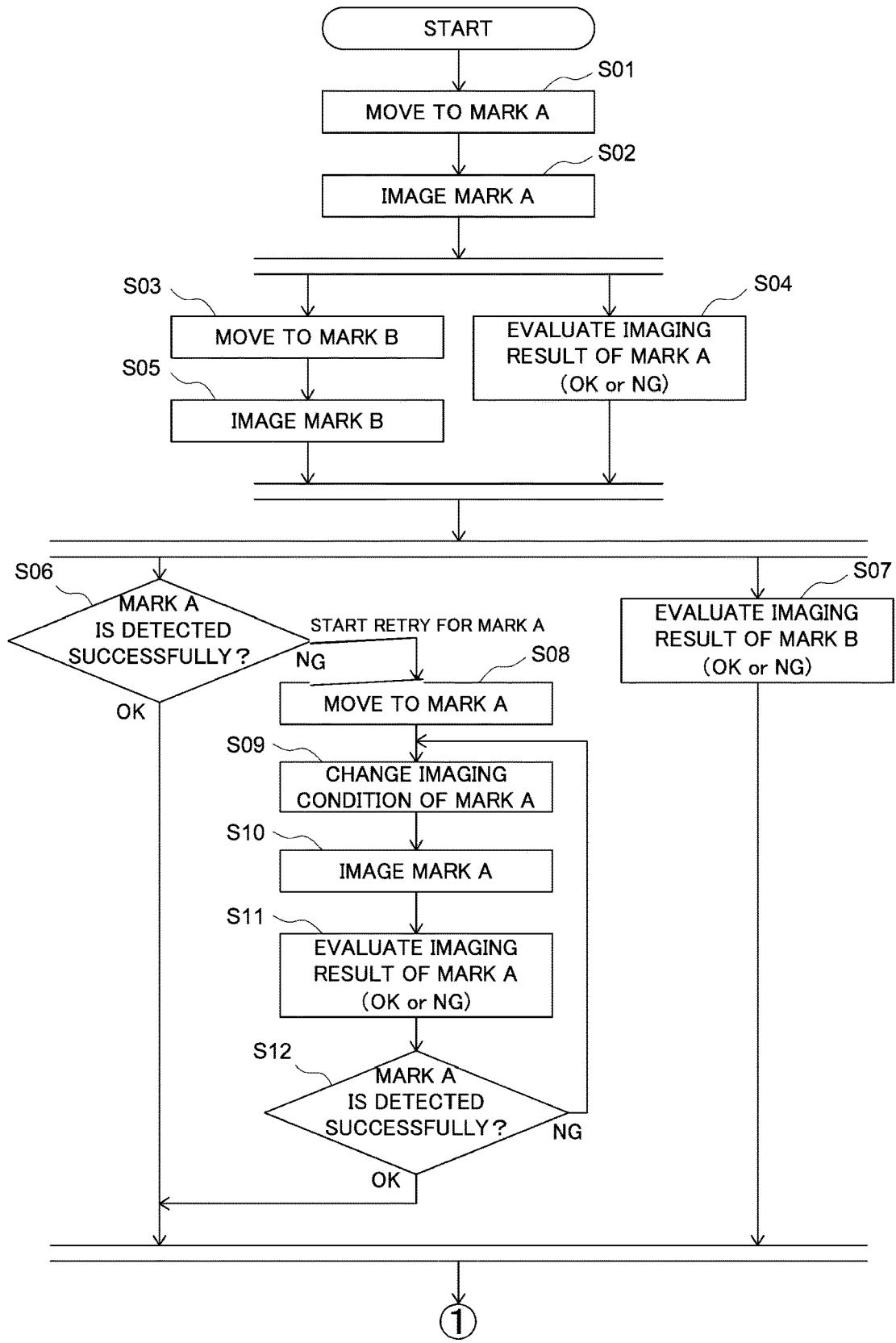
FIG. 5 is a flowchart showing part of a recognition mark extraction process according to one or more embodiments.
Figure 6:
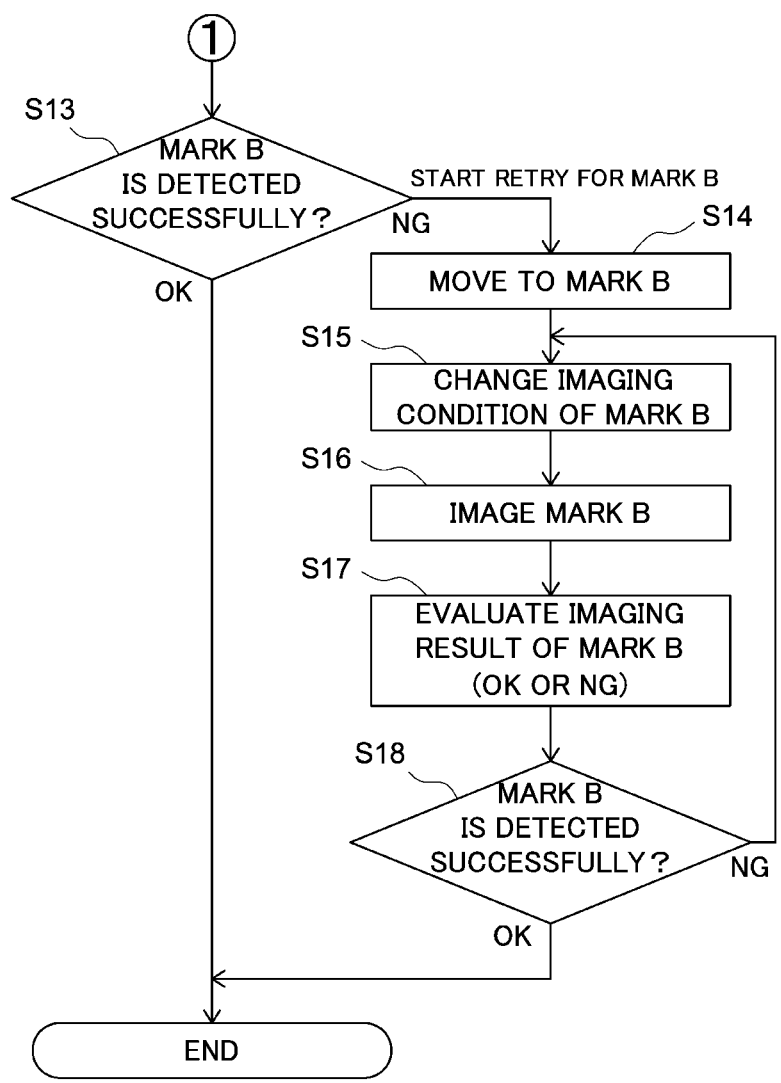
FIG. 6 is a flowchart showing part of the recognition mark extraction process according to one or more embodiments.
Figure 7:
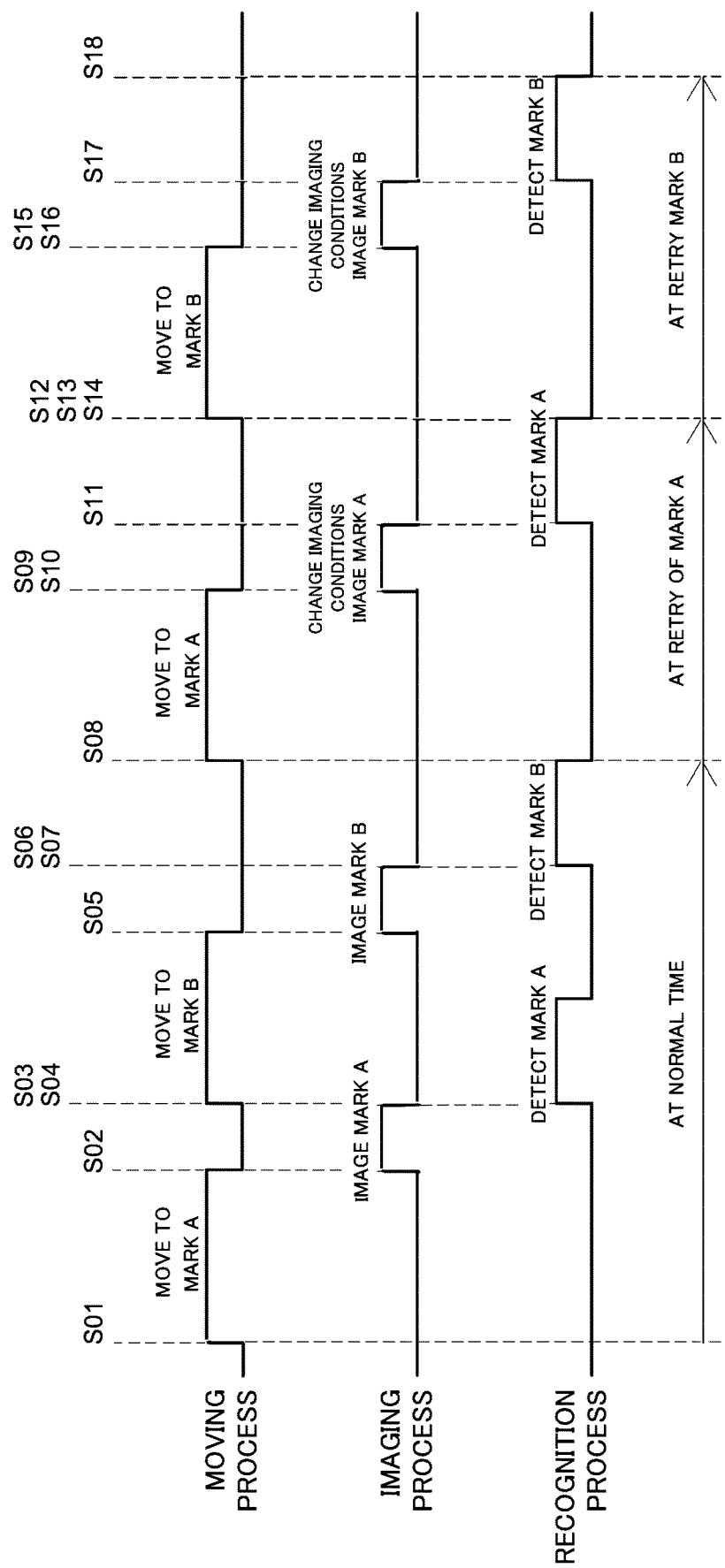
FIG. 7 is a timing chart showing timings of various processing operations in the recognition mark extraction process according to one or more embodiments.

As described above, when the printed circuit board P1 carried into the solder printing inspection device P3 is positioned and fixed at a predetermined inspection position, the controller 26 first executes a position detection process of the printed circuit board P1. The following describes the position detection process with reference to FIGS. 5 to 7. FIGS. 5 and 6 are flowcharts showing a recognition mark extraction process executed to detect the recognition marks [A] and [B]. FIG. 7 is a timing chart showing timings of various processing operations in the recognition mark extraction process.

The controller 26 first executes a moving process of moving the inspection unit 23 to adjust the imaging visual field K of the camera 23C to the first recognition range corresponding to the first recognition mark [A] on the printed circuit board P1 (step S01).

The controller 26 subsequently executes an imaging process of taking an image of the first recognition mark [A] on the printed circuit board P1 with radiating uniform lights from the first illuminator 23A and the second illuminator 23B (step S02).

After termination of the imaging process of the first recognition mark [A], the controller 26 starts a moving process of moving the inspection unit 23 to a position corresponding to the second recognition mark [B] on the printed circuit board P1 (step S03), and simultaneously starts a recognition process of the first recognition mark [A], based on the image data of the first recognition mark [A] taken by this imaging process (step S04).

According to one or more embodiments, the first recognition mark [A] is recognized by detecting the edge of the first recognition mark [A], based on luminance values of the respective pixels included in the image data. The method of recognition of the first recognition mark [A] is, however, not limited to this technique, but another technique such as pattern matching may be employed (the same applies to the second recognition mark [B] described later).

On termination of the recognition process of the first recognition mark [A], the controller 26 stores the result of the recognition in the calculation result storage device 35.

More specifically, the controller 26 stores an evaluation result of the image data that determines whether the first recognition mark [A] is recognizable from the image data obtained by the imaging process of step S02.

According to one or more embodiments, when the first recognition mark [A] is successfully recognized by the above recognition process, the controller 26 subsequently calculates position information (for example, central coordinate) of the first recognition mark [A] and stores the position information of the first recognition mark [A] along with the evaluation result described above into the calculation result storage device 35 (the same applies to the second recognition mark [B] described later). According to a modification, however, the calculation process of the position information of the first recognition mark [A] may be executed along with a calculation process of position information (for example, central coordinate) of the second recognition mark [B] in the process of detecting position information of the printed circuit board P1 after a successful recognition process of the second recognition mark [B] described later.

In the meanwhile, when the moving process of the inspection unit 23 to the position corresponding to the second recognition mark [B] is completed to adjust the imaging visual field K of the camera 23C to the second recognition range, the controller 26 executes an imaging process of taking an image of the second recognition mark [B] on the printed circuit board P1 with radiating uniform lights from the first illuminator 23A and the second illuminator 23B (step S05).

After termination of the imaging process of the second recognition mark [B], the controller 26 determines whether the first recognition mark [A] is successfully recognized, based on the evaluation result of the image data with regard to the first recognition mark [A] stored in the calculation result storage device 35 (step S06), and simultaneously starts a recognition process of the second recognition mark [B], based on the image data of the second recognition mark [B] obtained by the imaging process of step S05 (step S07).

When the determination process of step S06 gives a determination result showing that the first recognition mark [A] is successfully recognized, the controller 26 waits for termination of the recognition process of the second recognition mark [B] of step S07 and proceeds to a next process (step S13).

On termination of the recognition process of the second recognition mark [B] of step S07, the controller 26 stores the result of the recognition in the calculation result storage device 35 as in the case of the first recognition mark [A] described above, and proceeds to the next process (step S13).

When the determination process of step S06 does not give the determination result showing that the first recognition mark [A] is successfully recognized, on the other hand, the controller 26 starts a retry process with regard to the first recognition mark [A]. More specifically, the controller 26 starts a moving process of moving the inspection unit 23 (the imaging visual field K of the camera 23C) again to the position (first recognition range) corresponding to the first recognition mark [A] on the printed circuit board P1 (step S08). According to one or more embodiments (in the illustrated example of FIG. 7), the moving process (step S08) is started after termination of the recognition process of the second recognition mark [B] (step S07). This procedure is, however, not essential. According to a modification, the moving process (step S08) may be started before termination of the recognition process of the second recognition mark [B] (step S07).

After termination of the moving process of the inspection unit 23 to the position corresponding to the first recognition mark [A], the controller 26 executes a change process of imaging conditions with regard to the first recognition mark [A] (step S09). According to a modification, the change process (step S09) may be executed during the moving process of the inspection unit 23.

According to one or more embodiments, the controller 26 determines the excess or deficiency of the light intensity, based on the image data with regard to the first recognition mark [A] obtained by the previous imaging process and changes the light intensities of the uniform lights emitted from the first illuminator 23A and the second illuminator 23B. For example, when the image of the first recognition mark [A] taken as the image data is larger than the image stored as the gerber data, the controller 26 determines that the light intensity is excess and accordingly decreases the luminance values of the lights emitted from the first light source 23Aa and the second light source 23Ba. In another example, when the image of the first recognition mark [A] taken as the image data is smaller with partial missing than the image stored as the gerber data, on the other hand, the controller 26 determines that the light intensity is deficient and accordingly increases the luminance values of the lights emitted from the first light source 23Aa and the second light source 23Ba. A modification may be configured to regulate the light intensities by controlling the liquid crystal shutters 23Ab and 23Bb.

On completion of the imaging process of the inspection unit 23 to adjust the imaging visual field K of the camera 23C to the first recognition range and the change process of the imaging conditions, the controller 26 executes a re-imaging process of taking an image of the first recognition mark [A] on the printed circuit board P1 again with radiating the uniform lights of the changed conditions from the first illuminator 23A and the second illuminator 23B (step S10).

After termination of the re-imaging process of the first recognition mark [A], the controller 26 executes a re-recognition process of the first recognition mark [A], based on the image data of the first recognition mark [A] obtained by the re-imaging process (step S11). The re-recognition process of the first recognition mark [A] is similar to the recognition process (step S04) described above and is not described in detail (the same applies to a re-recognition process of the second recognition mark [B] described later).

The controller 26 subsequently determines whether the first recognition mark [A] is successfully recognized, based on the evaluation result of the image data with regard to the first recognition mark [A] (step S12). When the determination process gives a determination result showing that the first recognition mark [A] is successfully recognized, the controller 26 proceeds to the next process (step S13).

When the determination process of step S12 does not give the determination result showing that the first recognition mark [A] is successfully recognized, on the other hand, the controller 26 returns to the change process of the imaging conditions of step S09 described above and repeatedly executes the processing of step S09 to step S12 until the first recognition mark [A] is successfully recognized.

When the first recognition mark [A] is successfully recognized, the controller 26 determines whether the second recognition mark [B] is successfully recognized, based on the evaluation result of the image data with regard to the second recognition mark [B] stored in the calculation result storage device 35 (step S13).

When the determination process of step S13 gives a determination result showing that the second recognition mark [B] is successfully recognized, the controller 26 terminates the recognition mark extraction process.

When the determination process of step S13 does not give the determination result showing that the second recognition mark [B] is successfully recognized, on the other hand, the controller 26 starts a retry process with regard to the second recognition mark [B]. More specifically, the controller 26 starts a moving process of moving the inspection unit 23 (the imaging visual field K of the camera 23C) again to the position (second recognition range) corresponding to the second recognition mark [B] on the printed circuit board P1 (step S14).

When the retry process with regard to the first recognition mark [A] (processing of step S08 to step S12) is not executed, i.e., when appropriate image data with regard to the first recognition mark [A] is obtained by the first imaging process (step S02), the imaging visual field K of the camera 23C has already been adjusted to the second recognition range. The moving process of step S14 is thus practically omitted. In this case, the moving process of step S14 is executed as a confirmation process of checking whether the imaging visual field K of the camera 23C positioned to the second recognition range.

After termination of the moving process (confirmation process) of the inspection unit 23 to the position corresponding to the second recognition mark [B], the controller 26 executes a change process of the imaging conditions with regard to the second recognition mark [B] (step S15). The change process of the imaging conditions with regard to the second recognition mark [B] (step S15) is similar to the change process of the imaging conditions with regard to the first recognition mark [A] (step S09) and is thus not described in detail.

On completion of the imaging process of the inspection unit 23 to adjust the imaging visual field K of the camera 23C to the second recognition range and the change process of the imaging conditions, the controller 26 executes a re-imaging process of taking an image of the second recognition mark [B] on the printed circuit board P1 again with radiating the uniform lights of the changed conditions from the first illuminator 23A and the second illuminator 23B (step S16).

After termination of the re-imaging process of the second recognition mark [B], the controller 26 executes a re-recognition process of the second recognition mark [B], based on the image data of the second recognition mark [B] obtained by the re-imaging process (step S17).

The controller 26 subsequently determines whether the second recognition mark [B] is successfully recognized, based on the evaluation result of the image data with regard to the second recognition mark [B] (step S18). When the determination process gives a determination result showing that the second recognition mark [B] is successfully recognized, the controller 26 terminates the recognition mark extraction process.

When the determination process of step S18 does not give the determination result showing that the second recognition mark [B] is successfully recognized, on the other hand, the controller 26 returns to the change process of the imaging conditions of step S15 described above and repeatedly executes the processing of step S15 to step S18 until the second recognition mark [B] is successfully recognized.

On termination of the recognition mark extraction process shown in FIGS. 5 to 7, the controller 26 calculates position information (for example, the inclination and the positional misalignment) of the printed circuit board P1, based on the position information (coordinates) of the first recognition mark [A] and the second recognition mark [B] detected by the recognition mark extraction process and position information (coordinates) of the first recognition mark [A] and the second recognition mark [B] stored as the gerber data. The controller 26 then terminates the position detection process of the printed circuit board P1. The controller 26 subsequently executes a correction process of correcting the misalignment of the relative positional relationship between the inspection unit 23 (camera 23C) and the printed circuit board P1, based on the position information of the printed circuit board P1.

The controller 26 subsequently starts a moving process of moving the inspection unit 23 to a position corresponding to the "first" inspection range on the printed circuit board P1 according to the inspection sequence stored in the set data storage device 36.

On completion of the moving process of the inspection unit 23 to adjust the imaging visual field K of the camera 23C to the "first" inspection range on the printed circuit board P1, the controller 26 executes an inspection process with regard to the "first" inspection range on the printed circuit board P1 with radiating a striped pattern from the first illuminator 23A or the second illuminator 23B. The details of this inspection process will be described later (the same applies to the inspection process with regard to any other inspection range).

On termination of the inspection process with regard to the "first" inspection range on the printed circuit board P1, the controller 26 starts a moving process of moving the inspection unit 23 to a position corresponding to the "second" inspection range on the printed circuit board P1 according to the inspection sequence stored in the set data storage device 36.

The controller 26 then similarly executes inspection processes with regard to the "second" to the "fifteenth" inspection ranges on the printed circuit board P1 to terminate inspection with regard to the entire printed circuit board P1.

The following describes the inspection process executed with regard to each of the inspection ranges on the printed circuit board P1. This inspection process is executed by the controller 26 (the CPU and the like 31).

According to one or more embodiments, in inspection with regard to each of the inspection ranges on the printed circuit board P1, the controller 26 executes four imaging processes under the first patterned light having different phases with changing the phase of the first patterned light radiated from the first illuminator 23A and subsequently executes four imaging processes under the second patterned light having different phases with changing the phase of the second patterned light radiated from the second illuminator 23B, so as to obtain a total of eight different image data. This series of processing is described in detail below.

As described above, the controller 26 first drives and controls the X axis moving mechanism 23D and the Y axis moving mechanism 23E to move the inspection unit 23 and adjust the imaging visual field K of the camera 23C to a predetermined inspection range on the printed circuit board P1, subsequently executes switching control of the liquid crystal shutters 23Ab and 23Bb of the two illuminators 23A and 23B, and sets the positions of the first grating and the second grating formed by the two liquid crystal shutters 23Ab and 23Bb to predetermined reference positions.

On completion of changeover and setting of the first grating and the second grating, the controller 26 causes light emission from the first light source 23Aa of the first illuminator 23A to radiate the first pattered light and drives and controls the camera 23C to execute a first imaging process under the first patterned light.

Simultaneously with termination of the first imaging process under the first patterned light, the controller 26 turns off the first light source 23Aa of the first illuminator 23A and executes a switching process of the first liquid crystal shutter 23Ab. More specifically, the controller 26 changes over and sets the position of the first grating formed by the first liquid crystal shutter 23Ab from the reference position to a second position having the phase of the first patterned light shifted by ¼ pitch (90 degrees).

On completion of changeover and setting of the first grating, the controller 26 causes light emission from the light source 23Aa of the first illuminator 23A to radiate the first pattered light and drives and controls the camera 23C to execute a second imaging process under the first patterned light. Four different image data under the first patterned light have the phases differing by 90 degrees each are obtained by repeatedly executing this series of processing.

The controller 26 subsequently causes light emission from the second light source 23Ba of the second illuminator 23B to radiate the second pattered light and drives and controls the camera 23C to execute a first imaging process under the second patterned light.

Simultaneously with termination of the first imaging process under the second patterned light, the controller 26 turns off the second light source 23Ba of the second illuminator 23B and executes a switching process of the second liquid crystal shutter 23Bb. More specifically, the controller 26 changes over and sets the position of the second grating formed by the second liquid crystal shutter 23Bb from the reference position to a second position having the phase of the second patterned light shifted by ¼ pitch (90 degrees).

On completion of changeover and setting of the second grating, the controller 26 causes light emission from the light source 23Ba of the second illuminator 23B to radiate the second pattered light and drives and controls the camera 23C to execute a second imaging process under the second patterned light. Four different image data under the second patterned light have the phases differing by 90 degrees each are obtained by repeatedly executing this series of processing.

The controller 26 then executes three-dimensional measurement (height measurement) of the solder paste 53 by the known phase shift method, based on the four different image data taken under each of the patterned lights and stores the results of measurement into the calculation result storage device 35. One or more embodiments execute three-dimensional measurement by radiating the patterned lights from two different directions. This configuration prevents the occurrence of any shade portion that is not irradiated with any patterned light.

The controller 26 subsequently executes a quality judgment process of the solder paste 53, based on the result of the three-dimensional measurement. More specifically, the controller 26 detects a printing range of the solder paste 53 that is higher than a reference plane, based on the measurement result of an inspection range obtained as described above, and integrates the heights at respective positions in the detected range to calculate the amount of the printed solder paste 53.

The controller 26 then compares the data of the solder paste 53 regarding the position, the area, the height or the amount of the solder paste 53 thus obtained with reference data (for example, gerber data) stored in advance in the set data storage device 36 and determines whether the result of the comparison is in an allowable range, so as to determine the good/poor quality of the printing state of the solder paste 53 in the inspection range.

While executing the good/poor quality determination described above after acquisition of the eight different image data as described above, the controller 26 moves the inspection unit 23 to a next inspection range. The above series of processing is repeatedly executed with regard to all the inspection ranges on the printed circuit board P1, so as to terminate inspection of the entire printed circuit board p1.

As described above in detail, the configuration of one or more embodiments executes the recognition process with regard to the first recognition mark [A] during the relative movement of the inspection unit 23 (the camera 23C) to the position corresponding to the second recognition mark [B] after termination of the imaging process with regard to the first recognition mark [A].

After termination of the imaging process with regard to the first recognition mark [A], the configuration of one or more embodiments starts the relative movement of the inspection unit 23 to the position corresponding to the second recognition mark [B] without waiting for the result of the recognition process, regardless of whether the first recognition mark [A] is successfully recognized. As a result, this configuration increases the speed of position detection of the printed circuit board P1 when the first recognition mark [A] and the second recognition mark [B] are successfully recognized without the retry process (re-imaging process and re-recognition process).

In the case of a failure in recognizing at least one of the first recognition mark [A] and the second recognition mark [B] by the recognition process executed with regard to the first recognition mark [A] and the second recognition mark [B], on the other hand, the configuration of one or more embodiments automatically executes the retry process (re-imaging process and re-recognition process). This configuration eliminates a need to stop the solder printing inspection device 13 (production line 10) and start the operator's manual operation. As a result, this configuration enhances the overall processing capacity and suppresses the productivity from being lowered.

Moreover, the configuration of one or more embodiments changes the imaging conditions in the case of executing the retry process. Accordingly, in the case of a failure in recognizing the first recognition mark [A] (or the second recognition mark [B]), the retry process is executed with automatically changing the imaging conditions (without the operator's manual operation). This configuration enables the first recognition mark [A] (or the second recognition mark [B]) of the failed recognition to be automatically recognized.

Additionally, in the change process of the imaging conditions, the configuration of one or more embodiments determines the excess or deficiency of the light intensity, based on the image data with regard to the first recognition mark [A] (or the second recognition mark [B]) obtained by the previous imaging process and changes the light intensities of the uniform lights emitted from the first illuminator 23A and the second illuminator 23B. As a result, this enables the retry process to be executed under the more appropriate imaging conditions.

Figure 8:
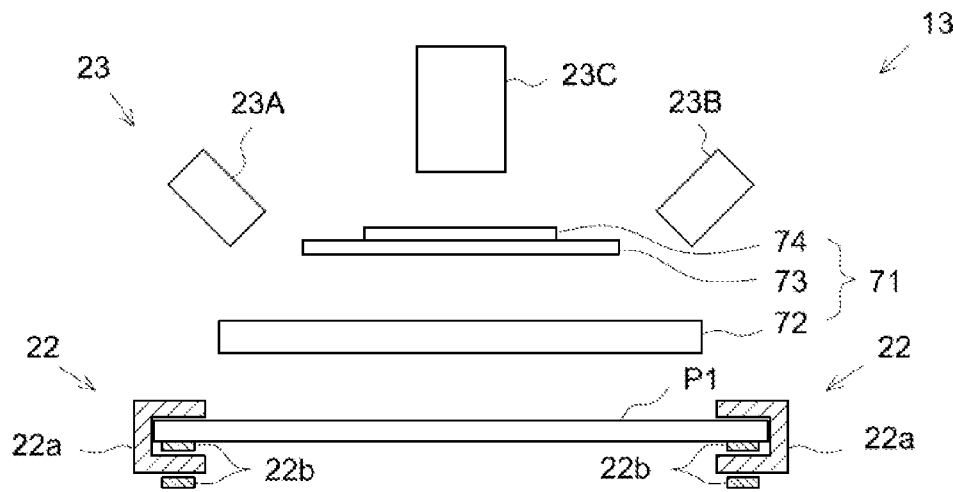
FIG. 8 is a schematic configuration diagram schematically illustrating a solder printing inspection device according to one or more embodiments.
Figure 9:
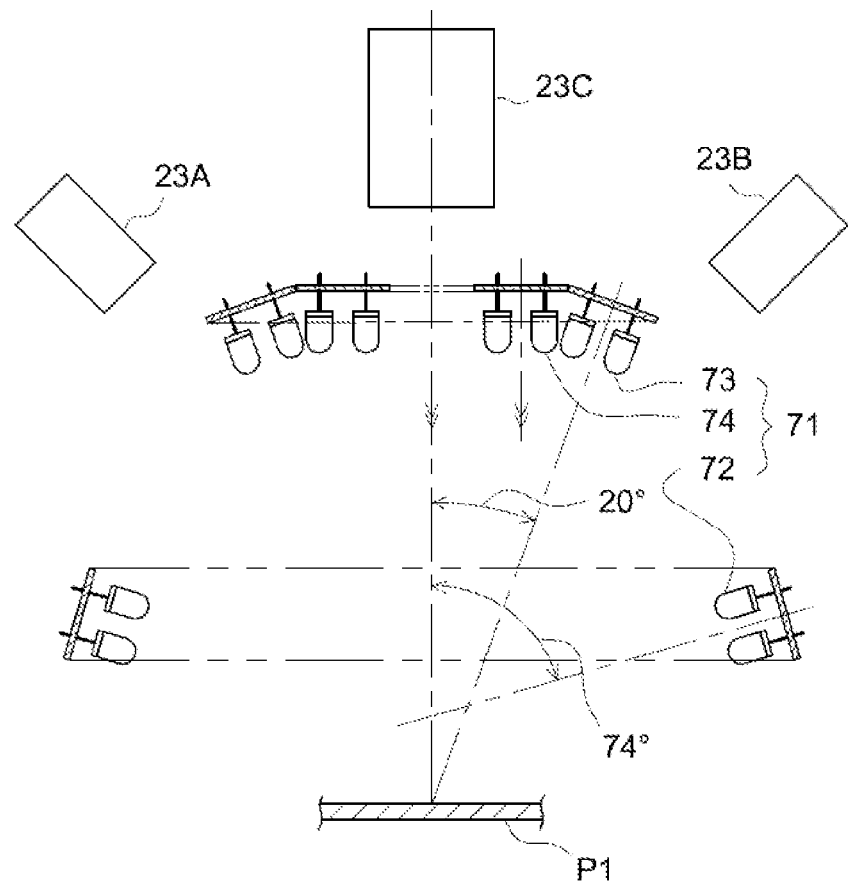
FIG. 9 is a partially enlarged sectional view illustrating a lighting device for position detection according to one or more embodiments.

The following describes embodiments of the present invention with reference to FIGS. 8 and 9. The like components to those of the aforementioned embodiments are expressed by the like reference signs, and their detailed description is omitted. FIG. 8 is a schematic configuration diagram schematically illustrating a solder printing inspection device 13 according to one or more embodiments. FIG. 9 is a partially enlarged sectional view illustrating a lighting device for position detection according to one or more embodiments.

In the solder printing inspection device 13 of the embodiments described above, the first illuminator 23A and the second illuminator 23B are configured to change over the radiation light between the light for three-dimensional measurement and the light for position detection. One or more embodiments are, on the other hand, provided with an illuminator for radiating the light for position detection separately from the first illuminator 23A and the second illuminator 23B serving as the irradiator exclusive for three-dimensional measurement.

More specifically, as shown in FIGS. 8 and 9, an inspection unit 23 of one or more embodiments is configured to include an illumination device 71 for position detection, in addition to the first illuminator 23A, the second illuminator 23B and the camera 23C.

The illumination device 71 includes a first ring light 72 placed nearest to the printed circuit board P1, a second ring light 73 placed second nearest to the printed circuit board P1, and a third ring light 74 placed farthest from the printed circuit board P1.

The respective ring lights 72 to 74 are configured to respectively change over and radiate monochromatic lights of three different colors, i.e., red light, green light and blue light. The first ring light 72 is configured to irradiate the printed circuit board P1 with light at a large angle of incidence (for example, 74 degrees). The second ring light 73 is configured to irradiate the printed circuit board P1 with light at a middle angle of incidence (for example, 20 degrees). The third ring light 74 is configured to irradiate the printed circuit board P1 with light at a small angle of incidence (for example, 0 degree).

Under the above configuration, in the recognition mark extraction process shown in FIGS. 5 and 6, the first imaging process with regard to the first recognition mark [A] (step S02) and the first imaging process with regard to the second recognition mark [B] (step S05) are executed under the monochromatic light emitted at the small angle of incidence from the third ring light 74 ("red light" according to one or more embodiments).

In the case of failing in recognition and executing a retry process with regard to the first recognition mark [A] (steps S09 to S12) and/or a retry process with regard to the second recognition mark [B] (steps S15 to S18), the second ring light 73 is added in the change process of the imaging conditions (step S09 and/or step S15). A re-imaging process (step S10 and/or step S16) is then executed under two radiation lights, i.e., the monochromatic light emitted at the small angle of incidence from the third ring light 74 ("red light" according to one or more embodiments) and the monochromatic light emitted at the middle angle of incidence from the second ring light 73 ("red light" according to one or more embodiments).

In the case of failing in recognition again and executing a second retry process with regard to the first recognition mark [A] and/or the second recognition mark [B], the monochromatic light emitted at the large angle of incidence from the first ring light 72 ("red light" according to one or more embodiments) is added in a second change process of the imaging conditions. A second re-imaging process is then executed under the monochromatic lights emitted from all the ring lights 72 to 74 ("red light" according to one or more embodiments).

Similarly, in the case of executing a third retry process, a third re-imaging process is executed under the monochromatic light emitted at the small angle of incidence from the third ring light 74 ("green light" according to one or more embodiments).

In the case of executing a fourth retry process, a fourth re-imaging process is executed under two radiation lights, i.e., the monochromatic light emitted at the small angle of incidence from the third ring light 74 ("green light" according to one or more embodiments) and the monochromatic light emitted at the middle angle of incidence from the second ring light 73 ("green light" according to one or more embodiments).

In the case of executing a fifth retry process, a fifth re-imaging process is executed under the monochromatic lights emitted from all the ring lights 72 to 74 ("green light" according to one or more embodiments).

In the case of executing a sixth retry process, a sixth re-imaging process is executed under the monochromatic light emitted at the small angle of incidence from the third ring light 74 ("blue light" according to one or more embodiments).

In the case of executing a seventh retry process, a seventh re-imaging process is executed under two radiation lights, i.e., the monochromatic light emitted at the small angle of incidence from the third ring light 74 ("blue light" according to one or more embodiments) and the monochromatic light emitted at the middle angle of incidence from the second ring light 73 ("blue light" according to one or more embodiments).

In the case of executing an eighth retry process, an eighth re-imaging process is executed under the monochromatic lights emitted from all the ring lights 72 to 74 ("blue light" according to one or more embodiments).

As described above in detail, one or more embodiments have similar functions and advantageous effects to those of the embodiments described above. The configuration of one or more embodiments is especially effective when the surfaces of the recognition marks [A] and [B] are not flat as in the case of a solder leveler product.

The embodiments described above are configured to determine the change process of the imaging conditions, based on the image data with regard to the first recognition mark [A] (or the second recognition mark [B]) obtained by the previous imaging process. One or more embodiments are, on the other hand, configured to change over and set the imaging conditions among the plurality of imaging conditions determined in advance in the predetermined sequence. This simplifies the change process of the imaging conditions.

The present invention is not limited to the description of the above embodiments but may be implemented, for example, by configurations described below. The present invention may also be naturally implemented by applications and modifications other than those illustrated below.

(a) According to the embodiments described above, the substrate position detection device is embodied as one function of the solder printing inspection device 13. This is, however, not essential. For example, the substrate position detection device may be provided as part of another device, such as the solder printing machine 12 or the component mounting machine 14, or may be provided independently.

(b) The substrate as the object of position detection by the substrate position detection device is not limited to the printed circuit board P1 described in the above embodiments but may be, for example, a different type of printed circuit board, such as a double-sided substrate or a wafer substrate different from the printed circuit board.

(c) The printed circuit board P1 according to the embodiments described above is configured to have the first recognition mark [A] and the second recognition mark [B] in the circular shape at the two corners aligned on the predetermined diagonal line among the four corners, as the recognition objects for position detection.

The number, the shape, the size, the position, the type and the like of the recognition object are, however, not limited to those described in the above embodiments. For example, recognition marks may be provided at three or more positions on the printed circuit board P1. In another example, a through hole that is pierced from the surface to the rear face of the printed circuit board may be used as the recognition object for position detection.

(d) The embodiments described above are configured to change the imaging conditions in the case of executing the retry process. This is, however, not essential. A modification may be configured to execute the retry process at least once without changing the imaging conditions.

(e) The details of the change process of the imaging conditions are not limited to the aforementioned embodiments. For example, one or more embodiments are configured to change the light intensity, the radiation angle of the radiation light and the like by sequentially adding the ring lights 72 to 74 of the illumination device 71 one by one. A modification may be configured to change the radiation angle of the light or to change (the position of) the light source from which light is emitted by changing over the illumination (light source) one by one, for example, in the sequence of the "third ring light 74", the "second ring light 73", and the "first ring light 72".

Another modification may be configured to change the luminance values of the ring lights 72 to 74 of the illumination device 71. Under this configuration, for example, in the case of a failure in recognizing the recognition marks [A] and [B] by changing the luminance value of the third ring light 74, the modification may be configured to change over the light source to the second ring light 73 (change the radiation angle). When an object is a solder leveler product, priority is given to the change of the radiation angle over the change of the light intensity in the change process of the imaging conditions.

Another modification may be configured to change the imaging condition (light intensity) by changing the exposure time of the camera 23C, the radiation time of the light or the like.

(f) The embodiments described above are configured to move the inspection unit 23 while fixing the printed circuit board P1. This configuration is, however, not essential. A modification may be configured to move the printed circuit board P1, while fixing the inspection unit 23.

(g) According to the embodiments described above, the inspection sequence is set to take the shortest way as the moving route of the inspection unit 23 from a predetermined inspection range that is determined in advance (in the illustrated example of FIG. 4, an inspection range at an upper right corner), as the starting point.

This is, however, not essential. According to a modification, the inspection sequence may be set to take the shortest way as the moving route of the inspection unit 23 from the second recognition mark [B] that is imaged last at the normal time (without any mark recognition error) between the first recognition mark [A] and the second recognition mark [B]

as the starting point, or from an inspection range located nearest to the second recognition mark [B] as the starting point.

According to another modification, in the case of executing the retry process, the inspection sequence may be set to take the shortest way as the moving route of the inspection range 23 from the first recognition mark [A] or the second recognition mark [B] that is subject to the last retry process as the starting point, or from an inspection range located nearest to the first recognition mark [A] or the second recognition mark [B] as the starting point.

The above configurations shorten the time period elapsed before a start of inspection with regard to the first inspection range and thereby increase the speed of the inspection.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

13 . . . solder printing inspection device, 22 . . . conveyance mechanism 23 . . . inspection unit, 23A . . . first illuminator, 23Aa . . . first light source, 23B . . . second illuminator, 23Ba . . . second light source, 23C . . . camera, 23D . . . X axis moving mechanism, 23E . . . Y axis moving mechanism, 26 . . . controller, 34 . . . image data storage device, 35 . . . calculation result storage device, 36 . . . set data storage device, A . . . first recognition mark, B . . . second recognition mark, K . . . imaging visual field, P1 . . . printed circuit board

The invention claimed is:

1. A substrate position detection device comprising:
an irradiator that irradiates a predetermined range of a substrate with a predetermined light;
an imager that takes an image of the predetermined range of the substrate irradiated with the predetermined light;
a moving mechanism that causes relative movement of the imager and the substrate; and
a controller that:
detects a position of the substrate by sequentially executing to a plurality of recognition objects on the substrate:
    a moving process of relatively moving the imager to a position corresponding to a predetermined recognition object among the plurality of recognition objects on the substrate;
    an imaging process of taking an image of the predetermined recognition object under a predetermined imaging condition; and
    a recognition process of recognizing the predetermined recognition object based on image data obtained by the imaging process;
after termination of the imaging process on the predetermined recognition object among the plurality of recognition objects, executes the recognition process on the predetermined recognition object, while executing the moving process of relatively moving the imager to a position corresponding to another recognition object different from the predetermined recognition object; and
when failing to recognize any recognition object that is not sequentially last among the plurality of recognition objects:
    causes the moving mechanism to relatively move the imager to a position corresponding to the recognition object that was not recognized,
    executes a re-imaging process of taking an image of the recognition object again, and
    executes a re-recognition process of recognizing the recognition object based on image data obtained by the re-imaging process.

2. The substrate position detection device according to claim 1,
wherein the controller executes a change process of changing the imaging condition when the re-imaging process is executed.

3. The substrate position detection device according to claim 2,
wherein a light intensity of the light emitted from the irradiator is changed as the imaging condition.

4. The substrate position detection device according to claim 2,
wherein a radiation angle of the light emitted from the irradiator is changed, or a light source contained in the irradiator to emit the light is changed, as the imaging condition.

5. The substrate position detection device according to claim 3,
wherein a radiation angle of the light emitted from the irradiator is changed, or a light source contained in the irradiator to emit the light is changed, as the imaging condition.

6. The substrate position detection device according to claim 2,
wherein a color of the light emitted from the irradiator is changed as the imaging condition.

7. The substrate position detection device according to claim 3,
wherein a color of the light emitted from the irradiator is changed as the imaging condition.

8. The substrate position detection device according to claim 4,
wherein a color of the light emitted from the irradiator is changed as the imaging condition.

9. The substrate position detection device according to claim 5,
wherein a color of the light emitted from the irradiator is changed as the imaging condition.

10. The substrate position detection device according to claim 1,
wherein the substrate is a printed circuit board on which an electronic component is mounted.

11. The substrate position detection device according to claim 2,
wherein the substrate is a printed circuit board on which an electronic component is mounted.

12. The substrate position detection device according to claim 3,
wherein the substrate is a printed circuit board on which an electronic component is mounted.

13. The substrate position detection device according to claim 4,
wherein the substrate is a printed circuit board on which an electronic component is mounted.

14. The substrate position detection device according to claim 5,
wherein the substrate is a printed circuit board on which an electronic component is mounted.

15. The substrate position detection device according to claim 6,
   wherein the substrate is a printed circuit board on which an electronic component is mounted.

16. The substrate position detection device according to claim 7,
   wherein the substrate is a printed circuit board on which an electronic component is mounted.

17. The substrate position detection device according to claim 8,
   wherein the substrate is a printed circuit board on which an electronic component is mounted.

18. The substrate position detection device according to claim 9,
   wherein the substrate is a printed circuit board on which an electronic component is mounted.

\* \* \* \* \*